(12) United States Patent
Morton et al.

(10) Patent No.: US 10,608,310 B1
(45) Date of Patent: Mar. 31, 2020

(54) VERTICALLY MEANDERED FREQUENCY SELECTIVE LIMITER

(71) Applicant: Raytheon Company, Waltham, MA (US)

(72) Inventors: Matthew A. Morton, Lynnfield, MA (US); Jason C. Soric, Bedford, MA (US); Gerhard Sollner, Lincoln, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/530,056

(22) Filed: Aug. 2, 2019

(51) Int. Cl.
| H01P 1/23 | (2006.01) |
| H01F 1/10 | (2006.01) |
| H01P 3/02 | (2006.01) |
| H01P 1/218 | (2006.01) |

(52) U.S. Cl.
CPC ............. H01P 1/23 (2013.01); H01F 1/10 (2013.01); H01P 1/218 (2013.01); H01P 3/026 (2013.01)

(58) Field of Classification Search
CPC .. H01P 1/215; H01P 1/218; H01P 1/23; H01P 1/227; H01P 3/003; H01P 3/006; H03G 11/006; H03G 11/00
USPC .......................... 333/17.2, 33, 34, 158, 81 A
See application file for complete search history.

(56) References Cited

U.S. PATENT DOCUMENTS

| 4,283,692 A | 8/1981 | Adam |
| 4,605,911 A | 8/1986 | Jin |
| 4,845,439 A | 7/1989 | Stitzer et al. |
| 4,980,657 A | 12/1990 | Stitzer et al. |
| 5,023,573 A | 6/1991 | Adam |
| 5,847,628 A | 12/1998 | Uchikoba et al. |
| 6,593,833 B2 | 7/2003 | Joines et al. |
| 6,998,929 B1 | 2/2006 | Adam |
| 7,656,167 B1 | 2/2010 | McLean |
| 8,933,763 B2 | 1/2015 | Fast |
| 9,300,028 B2 | 3/2016 | Morton et al. |
| 9,711,839 B2 | 7/2017 | Morton et al. |

(Continued)

FOREIGN PATENT DOCUMENTS

| CN | 206639899 U | 11/2017 |
| JP | 2001036155 A | 2/2001 |
| WO | WO 97/44850 | 11/1997 |

OTHER PUBLICATIONS

Response filed on Sep. 4, 2019 for Taiwan Application No. 107118892 with English Translation; 15 Pages.

(Continued)

*Primary Examiner* — Stephen E. Jones
(74) *Attorney, Agent, or Firm* — Daly, Crowley, Mofford & Durkee LLP

(57) ABSTRACT

A frequency selective limiter (FSL) having an input port and an output port can comprise a plurality of vertically stacked transmission line structures. Each of the transmission line structures can be electrically coupled to a transmission line structure disposed directly above it and with a first one of the plurality of vertically stacked transmission line structures having one end corresponding to the FSL input port and a second one of the plurality of vertically stacked transmission line structures having one end corresponding to the FSL output port. Each of the plurality of vertically stacked transmission line structures can comprise a magnetic material having first and second opposing surfaces and one or more conductors disposed on at least one of the surfaces of the magnetic material.

18 Claims, 4 Drawing Sheets

(56) References Cited

U.S. PATENT DOCUMENTS

| | | |
|---|---|---|
| 2003/0214364 A1 | 11/2003 | Cites et al. |
| 2004/0012458 A1 | 1/2004 | Amparan et al. |
| 2005/0093737 A1 | 5/2005 | Schoebel |
| 2007/0236400 A1 | 10/2007 | Rentz |
| 2009/0027144 A1 | 1/2009 | Saito |
| 2011/0043299 A1 | 2/2011 | Ding et al. |
| 2018/0366803 A1 | 12/2018 | Morton et al. |

OTHER PUBLICATIONS

Communication Pursuant to Rules 161(1) and 162 EPC dated Aug. 22, 2018 for European Application No. 17701955.1; 3 Pages.

International Preliminary Report on Patentability dated Jul. 26, 2018 for International Application No. PCT/US2017/012937; 11 Pages.

Interview Summary dated May 17, 2019 for U.S. Appl. No. 15/627,913; 3 Pages.

Notice of Allowance dated Apr. 10, 2017 for U.S. Appl. No. 14/996,881; 9 pages.

Notice of Allowance dated Aug. 1, 2019 for Australian Application No. 2017206716; 7 Pages.

Office Action dated Jul. 5, 2016 for U.S. Appl. No. 14/996,881; 10 pages.

Office Action dated Dec. 2, 2016 for U.S. Appl. No. 14/996,881; 7 pages.

Office Action dated Mar. 22, 2019 for Chinese Application No. 201780006651.3 with English Translation; 34 Pages.

Office Action dated Jun. 4, 2019 for Japanese Application No. 2018-536256 with English Translation; 8 Pages.

PCT Search Report and Written Opinion of the ISA dated Mar. 31, 2017 for International Application No. PCT/US2017/012937; 18 Pages.

Response to Communication Pursuant to Rules 161(1) and 162 EPC dated Aug. 22, 2018 for European Application No. 17701955.1 as filed on Feb. 22, 2019; 18 Pages.

Response to Office Action dated Mar. 22, 2019 for Chinese Application 201780006651.3 as filed on Aug. 6, 2019 with English Translation; 12 Pages.

Response to Office Action dated Jul. 5, 2016 for U.S. Appl. No. 14/996,881, filed Aug. 25, 2016; 10 Pages.

Response to Office Action dated Dec. 2, 2016 for U.S. Appl. No. 14/996,881, filed Feb. 16, 2017; 10 Pages.

Response to Restriction Requirement dated Oct. 29, 2018 for U.S. Appl. No. 15/627,913; 1 Page.

Restriction Requirement dated Oct. 29, 2018 for U.S. Appl. No. 15/627,913; 6 Pages.

Tsutsumi, et al.; "Magnetostatic-Wave Envelope Soliton in Microstrip Line Using YIG-Film Substrate"; IEEE Transactions on Microwave Theory and Techniques; vol. 48; No. 2; Feb. 1, 2000; 6 Pages.

Voluntary Amendment filed on Jul. 19, 2019 for Australian Application No. 2017206716; 13 Pages.

Warit, et al.; "Microwave Circulator Using Yttrium Iron Garnet Film"; Microwave Conference, 2000 Asia-Pacific; Dec. 3-6, 2000; 2 Pages.

U.S. Appl. No. 16/018,768, filed Jun. 26, 2018, Morton et al.

Adam et al., "Frequency Selective Limiters for High Dynamic Range Microwave Receivers;" IEEE Transactions on Microwave Theory and Techniques, vol. 41, No. 12; Dec. 1993; 5 Pages.

Chua et al., "Microfabricated Planar Helical Slow-Wave Structures Based on Straight-Edge Connections for THz Vacuum Electron Devices;" Terahertz Science and Technology, ISSN 1941-7411, vol. 4, No. 4; Dec. 1, 2011; pp. 208-229; 22 Pages.

Johnson, "Tapered Transitions;" Retrieved from https://web.archive.org/web/20180404124152; Article first printed in EDN Magazine; Oct. 11, 2001; 3 Pages.

Maleszka et al., "Broadband Stripline to Microstrip Transition with Constant Impedance Field Matching Section for Applications in Multilayer Planar Technologies;" Proceedings of $18^{th}$ International Conference on IEEE Microwave Radar and Wireless Communications (MIKON); Jun. 14, 2010; 4 Pages.

Seki et al., "Cross-Tie Slow-Wave Coplanar Waveguide on Semi-Insulating GaAs Substrates;" Electronic Letters, vol. 17, No. 25; Dec. 10, 1981; pp. 940-941; 2 Pages.

Stitzer et al., "A Multi-Octave Frequency Selective Limiter;" IEEE International Microwave Symposium (MTT-S Digest); Jun. 1983; 3 Pages.

Stitzer et al., "X-band YIG Limiters for FM/CW Radar;" Microwave Journal, vol. 20, No. 57; Dec. 1977; pp. 35-38; 1 Page (Abstract Only).

Suhl, "The Nonlinear Behavior of Ferrites at High Microwave Signal Levels;" Proceedings of the IRE, vol. 44, Issue 10; Oct. 1956; pp. 1270-1284; 15 Pages.

Thomann, "Characterization and Simulation of Bi-Quadratic Coplanar Waveguide Tapers for Time-Domain Applications;" Microwave Symposium Digest, 1993, IEEE MTT-S International; Jun. 14, 1993; 30 Pages.

PCT International Search Report and Written Opinion dated Nov. 27, 2018 for International Application No. PCT/US2018/034369; 17 Pages.

U.S. Non-Final Office Action dated Feb. 28, 2019 for U.S. Appl. No. 15/627,913; 13 Pages.

Response to U.S. Non-Final Office Action dated Feb. 28, 2019 for U.S. Appl. No. 15/627,913; Response filed May 23, 2019; 20 Pages.

U.S. Notice of Allowance dated Jul. 3, 2019 for U.S. Appl. No. 15/627,913; 6 Pages.

U.S. Non-Final Office Action dated Jul. 22, 2015 for U.S. Appl. No. 14/077,909; 10 pages.

Response to U.S. Non-Final Office Action dated Jul. 22, 2015 for U.S. Appl. No. 14/077,909; Response filed Oct. 8, 2015; 11 pages.

Second Response to U.S. Non-Final Office Action dated Jul. 22, 2015 for U.S. Appl. No. 14/077,909; Response filed Oct. 14, 2015; 11 pages.

U.S. Notice of Allowance dated Dec. 8, 2015 for U.S. Appl. No. 14/077,909; 10 Pages.

PCT International Search Report and Written Opinion dated Jul. 12, 2019 for International Application No. PCT/US2019/031661; 19 Pages.

Decision of Rejection (with English Translation) dated Nov. 12, 2019 for Taiwanese Application No. 107118892; 5 Pages.

VERTICALLY MEANDERED FREQUENCY SELECTIVE LIMITER

GOVERNMENT SUPPORT

This disclosure was supported, in whole or in part, by a grant W911NF-17-C-0031 from DARPA. The Government has certain rights in this disclosure.

BACKGROUND

As is known in the art, a frequency selective limiter (FSL) is a nonlinear passive device that attenuates signals above a predetermined threshold power level while passing signals below the threshold power level. One feature of the FSL is the frequency selective nature of the high-power limiting: low power signals close in frequency to the limited signals are substantially unaffected (i.e., the FSL does not substantially attenuate such signals).

A typical implementation of an FSL includes a stripline transmission line structure using two layers of dielectric material disposed about the stripline, with the stripline having a fixed length and a fixed width along the length of the FSL. Such structures are relatively simple to fabricate and provide adequate magnetic fields to realize a critical power level of approximately 0 dBm when using a single crystal material. One method of reducing the threshold power level is to use a lower-impedance stripline at the cost of degraded return loss. An external matching structure can be used to improve the impedance match, but this technique reduces the bandwidth and increases the insertion loss of the FSL. Permanent biasing magnets can be mounted to, or near, the FSL structure to produce a bias field. The strength of the magnetic field within the structure establishes the operating bandwidth of the limiter.

SUMMARY

According to one aspect of the present disclosure, a frequency selective limiter (FSL) has an input port and an output port. The FSL can include a plurality of vertically stacked transmission line structures, wherein each one of the plurality of vertically stacked transmission line structures is electrically coupled to a transmission line structure disposed directly above it. A first one of the transmission line structures can have one end corresponding to the FSL input port and a second one of the transmission line structures can have one end corresponding to the FSL output port. Each of the plurality of vertically stacked transmission line structures can include a magnetic material having first and second opposing surfaces and one or more conductors disposed on at least one of the surfaces of the magnetic material.

In some embodiments, the FSL can include a substrate disposed between each of the plurality of vertically stacked transmission line structures.

In certain embodiments, the FSL can include a first bias magnet disposed along a first length of the plurality of vertically stacked transmission line structures and a second bias magnet disposed along a second length of the plurality of vertically stacked transmission line structures. In some embodiments, the first and second bias magnets can be disposed such that they establish a DC magnetic field having a direction which is substantially parallel to a direction of an RF magnetic field. In particular embodiments, the first and second bias magnets can be disposed such that they establish a DC magnetic field having a direction which is substantially perpendicular to a direction of an RF magnetic field.

In some embodiments, each subject transmission line structure can be shorter than a transmission line structure disposed directly below the subject transmission line structure. In particular embodiments, the FSL can include an input connector coupled to a bottom-most transmission line structure of the plurality of vertically stacked transmission line structures, and an output connector coupled to a top-most transmission line structure of the plurality of vertically stacked transmission line structures.

In certain embodiments, the FSL can include an input connector coupled to a top-most transmission line structure of the plurality of vertically stacked transmission line structures, and an output connector coupled to a bottom-most transmission line structure of the plurality of vertically stacked transmission line structures.

In some embodiments, the magnetic material of any of the plurality of vertically stacked transmission line structures can include a ferrite material. The ferrite material can include one or more of: a Yttrium iron garnet (YIG), a single crystal (SC) YIG, polycrystalline (PC) YIG, hexagonal ferrite, or a variety of doped YIG materials, as well as calcium vanadium garnet (CVG), Lithium Ferrite, or Nickel Zinc Ferrite. In certain embodiments, two or more of the plurality of vertically stacked transmission line structures may include different ferrite material from one another.

In particular embodiments, the FSL may include a fixture configured to house the plurality of vertically stacked transmission line structures. In some embodiments, the FSL can include wire bonds configured to electrically couple each of the subject transmission line structures is to the transmission line structure disposed directly above the subject transmission line structure.

In certain embodiments, one or more conductors are disposed on the first surface of the magnetic material to form a coplanar waveguide (CPW) transmission line. A first one of the one or more conductors may correspond to a first signal conductor having a width that decreases from a first end of the CPW transmission line to a second end of the CPW transmission line.

In some embodiments, one or more conductors disposed on a first surface of the magnetic material may correspond to a signal conductor having a width that decreases from a first end to a second end. In certain embodiments, the FSL may include two ground conductors disposed on a second surface of the magnetic material and defining a gap therebetween. A width of the gap may decrease from the first end to the second end. In particular embodiments, the FSL may include two first ground conductors disposed on a second surface of the magnetic material and defining a gap therebetween. As the width of the first signal conductor decreases, a spacing between the two first ground conductors may taper so as to maintain a transmission-line impedance the same as at first and second ends of the first signal conductor.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

The dynamic range of frequency selective limiters (FSLs) is related to the length of the transmission line used. In general, to increase FSL dynamic range, the length of the FSL transmission line must be increased. To minimize the packaging footprint and reduce cost, the additional length can be achieved using a so-called "in-plane meandering" configuration whereby the microstrip does not extend along a straight line, but instead traverses side to side along the length of the substrate. Various FSLs have been proposed that use meandered variants of either microstrip or coplanar waveguide (CPW) transmission lines.

It is recognized herein that in-plane meandering can lead to a restriction in the useful bandwidth of the FSL device, typically resulting in a useful fractional bandwidth of only 20% for state-of-the-art devices. For example, conventional FSLs may use meandering in the plane of the bias magnetic field, ensuring that a substantial portion of the RF magnetic field (or "H-field") is perpendicular to the bias magnetic field, thereby restricting available bandwidth. This can cause two problems that restrict bandwidth. First, magnetostatic surface waves (MSW) generated in the lower frequency regions may block off a wide range of available frequencies on the low end. Second, the perpendicular bias has a power threshold with a strong frequency dispersion, which can limit the useful frequency range above the MSW band to only 10-20% bandwidth.

Prior approaches to solve these problems involve in-plane tapering using a variety of coplanar and microstrip transmission lines with both parallel and perpendicular biasing. However, prior approaches exhibit restricted bandwidth performance. Lumped element approaches have also been attempted to reduce component size, however these components also restrict bandwidth and may have reduced limiting capability.

The present disclosure overcomes these and other limitations found in the prior art by enabling co-packaging of multiple FSLs (e.g., three or more FSLs) within the same magnetic bias fixture while using so-called "vertical meandering" to ensure that no perpendicular field components are present in the ferrite material. Embodiments of the present disclosure can perform over multi-octave bandwidth while achieving a significant reduction in component length.

Figure 1:
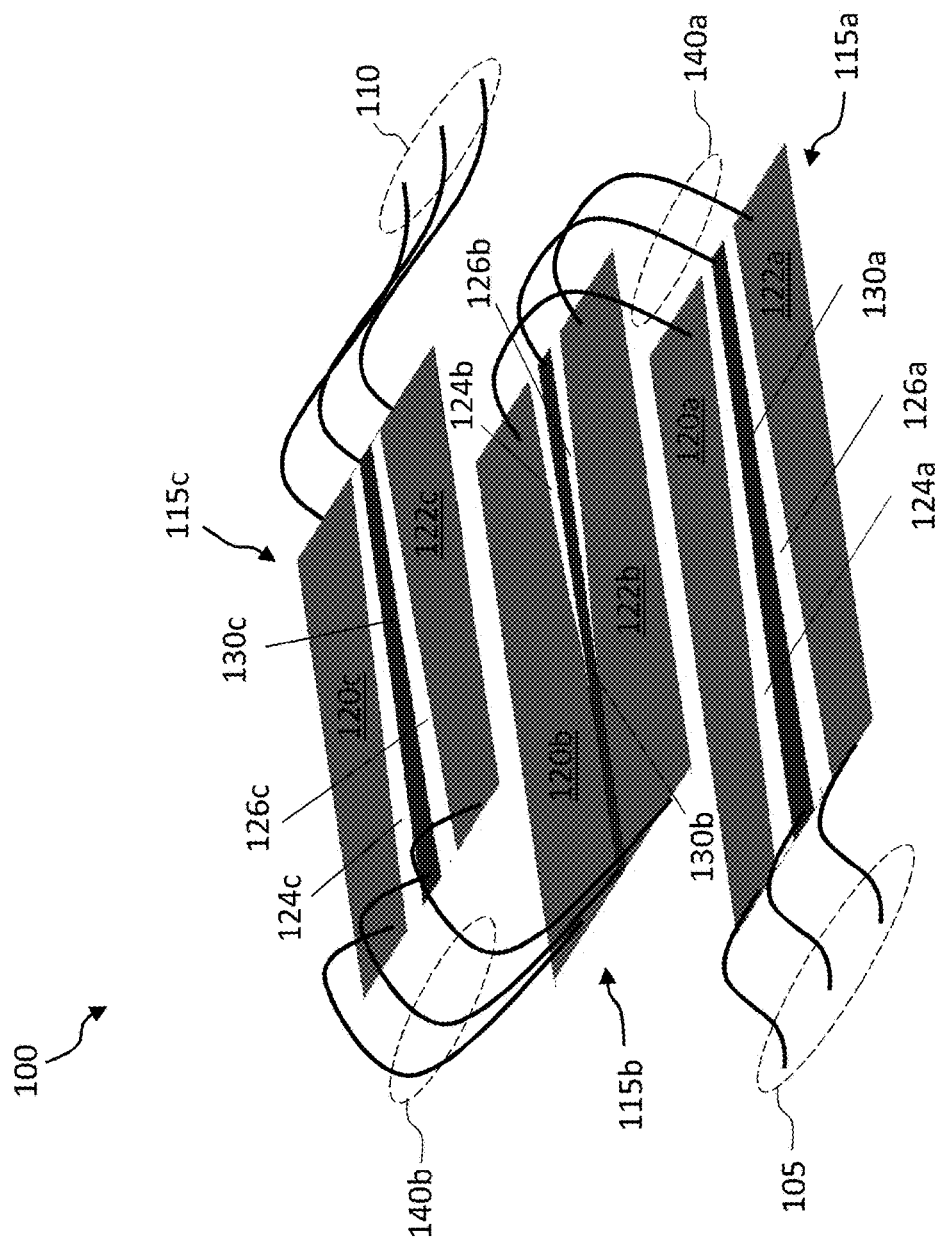
FIG. 1 is a perspective view of a frequency selective limiter (FSL) according to some embodiments of the present disclosure.

FIG. 1 shows an example of a frequency selective limiter (FSL), according to some embodiments of the present disclosure. The illustrative FSL 100 includes a plurality of transmission line structures provided in a vertically stacked arrangement (also referred to herein as "vertically meandered"). In this example, the FSL includes three transmission line structures 115a, 115b, 115c (115 generally). A skilled artisan will understand that an FSL according to the present disclosure can include other numbers of transmission line structures 115, such as two, four, five, or more than five transmission line structures 115. In some embodiments, an FSL can have at least three transmission line structures 115.

Each of the plurality of vertically stacked transmission line structures 115 can include a substrate comprised of magnetic material and one or more conductors disposed on one or more surfaces of the substrate. In some embodiments, the magnetic material may comprise a ferrite material, such as yttrium iron garnet (YIG), single crystal yttrium iron garnet (SC-YIG), polycrystalline yttrium iron garnet (PC-YIG), hexagonal ferrite, calcium vanadium garnet (CVG), lithium ferrite, or nickel zinc ferrite. In certain embodiments, two or more substrates within the same FSL 100 may be comprised of different ferrite materials from one another. For example, one substrate may comprise PC-YIG and another substrate may comprise SG-YIC.

The one or more conductors disposed over the magnetic substrate may form a coplanar waveguide (CPW) transmission line, as illustrated in FIG. 1. In particular, each transmission line structure 115 can include a signal conductor together with a pair of ground conductors, one to either side of the signal conductor and separated therefrom by gaps. In the example of FIG. 1, a first transmission line structure 115a includes signal conductor 130a separated from ground conductors 120a and 122a by gaps 124a and 126a, respectively; a second transmission line structure 115b includes signal conductor 130b separated from ground conductors 120b and 122b by gaps 124b and 126b, respectively; and a third transmission line structure 115c includes signal conductor 130c separated from ground conductors 120c and 122c by gaps 124c and 126c, respectively.

Each of the CPW transmission line structures 115a, 115b, 115c (115 generally) may have a so-called "tapered" design. In particular, the width of the signal conductor 130 may decrease along the length of corresponding transmission line structure 115. As the width of the signal conductor 130 decreases, a spacing between the two corresponding ground conductors 120, 122 may taper to maintain a particular transmission-line impedance along the length of the signal conductor 130.

In some embodiments, the direction of the tapering may alternate between vertically adjacent pairs of transmission line structures 115. For example, as shown in FIG. 1, the width of conductor 130a on the first transmission line structure 115a can decrease from left to right (relative to the drawing page), the width of conductor 130b on the second transmission line structure 115b can decrease from right to left, and the width of conductor 130c on the third transmission line structure 115c can decrease from left to right.

In some embodiments, at least one transmission line structure 115 may be provided having a signal conductor 130 disposed on a first surface of the substrate (e.g., a YIG material) and having ground conductors 120, 122 disposed on a second surface of the substrate.

Each of the plurality of vertically stacked transmission line structures 115 can be electrically coupled to the transmission line structure 115 disposed directly above it. In certain embodiments, vertically adjacent pairs of transmission line structures 115 may be electrically coupled to each other using a wire bonding technique. For example, as shown in FIG. 1, first transmission line structure 115a may be electrically coupled to second transmission line structure 115b via wire bonds 140a, and second transmission line structure 115b may be electrically coupled to third transmission line structure 115c via wire bonds 140b. Each set of wire bonds 140a, 140b (140 generally) may include three wires to connect the three conductors of one transmission line structure 115 (i.e., the signal conductor 130 and the two ground conductors 120, 122) to the corresponding three conductors on the adjacent transmission line structure 115, as illustrated in FIG. 1.

While embodiments of the present disclosure are shown and described using tapered CWL elements, a skilled artisan will understand that the concepts and structures sought to be protected herein are compatible with various types of FSL transmission line and lumped element topologies. For example, the vertical stacking approach disclosed herein can be used with many different classes of parallel-biased transmission lines.

The FSL 100 can also include an input port (or "connector") 105 and an output port 110, as shown in FIG. 1. Input port 105 may be coupled to a transmission line structure located at the bottom of the vertical stack (e.g., structure 115a) and output port 110 may be coupled to a transmission line structure located at the top of the stack (e.g., structure 115c). In other embodiments, input port 105 may be coupled to the top-most transmission line structure and output port 110 may be coupled to the bottom-most structure. In some embodiments, ports 105, 110 may be provided as SMA (SubMiniature version A) connectors.

Figure 3:
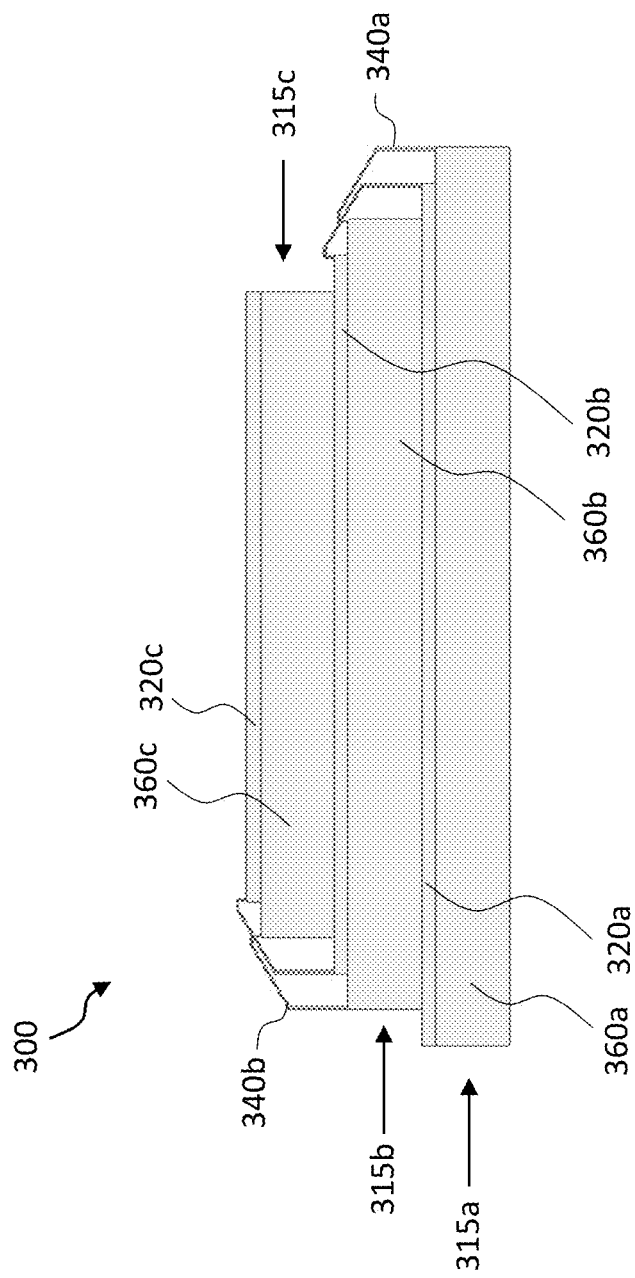
FIG. 3 is a side-view of an FSL according to some embodiments of the present disclosure.

In some embodiments, the vertically stacked transmission line structures 115 may be spaced apart from each other using a laminate material, as shown in FIG. 3 and discussed below in conjunction therewith. In particular embodiments, the FSL 100 may include a fixture (not shown) configured to house the plurality of vertically stacked transmission line structures 115.

Figure 2:
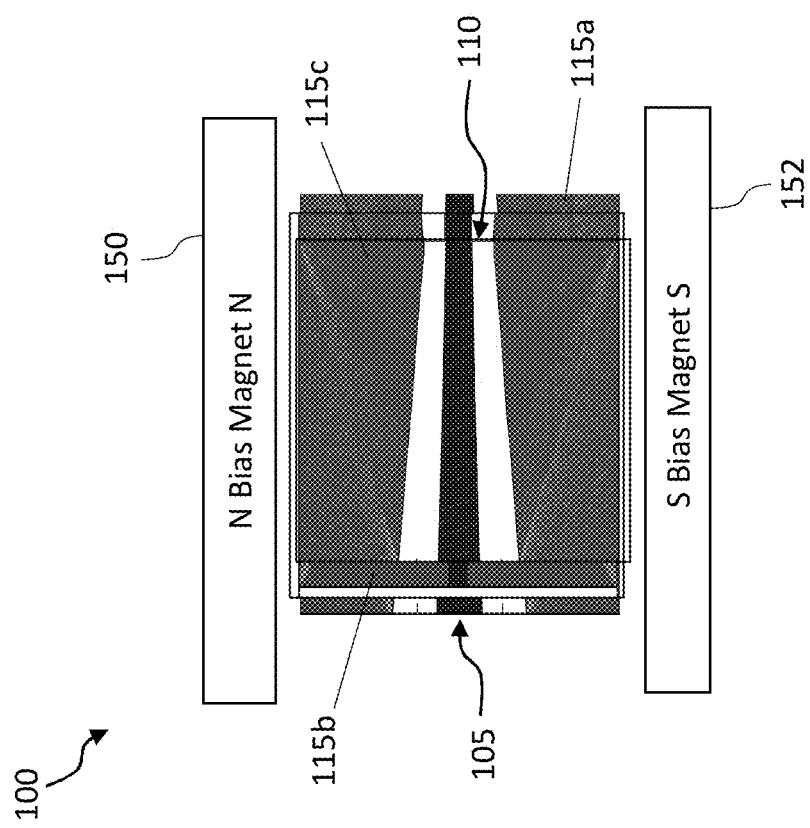
FIG. 2 is a top view of a magnetically biased FSL according to some embodiments of the present disclosure.

Referring to FIG. 2, the FSL 100 can include bias magnets disposed along the lengths of the vertically stacked transmission line structures 115, according to some embodiments of the present disclosure. In the example of FIG. 1, the FSL 100 includes a first bias magnet 150 disposed along one side of the transmission line structures 115 and a second bias magnet 152 disposed along an opposite side of the transmission line structures 115. The bias magnets 150, 152 may be disposed such that they establish a DC magnetic field (or "bias field") having a direction which is substantially parallel to a direction of an RF magnetic field generated by the transmission line structures 115 during operation. In other embodiments, the bias magnets 150, 152 can be disposed such that they establish a DC magnetic field having a direction which is substantially perpendicular to a direction of the RF magnetic field. It is appreciated herein that maintaining a shared DC magnetic field across the plurality of vertically stacked transmission line structures can achieve wider bandwidth than is possible using prior art techniques. In addition, sharing bias magnets across multiple stacked transmission line structures can significantly reduce the packaged component size compared to prior art techniques.

As shown in the embodiment of FIG. 2, each transmission line structure 115 may be shorter than the transmission line structure disposed directly below it in the vertical stack. For example, transmission line structure 115b may be shorter than transmission line structure 115a and transmission line structure 115c may be shorter than transmission line structure 115b. This arrangement can provide clearance for the wire bonds 140 (FIG. 1) that interconnect those structures while allowing for the use of wire bonds that are shorter than would otherwise be possible, thereby reducing parasitics.

FIG. 3 shows an example of a stacked biplanar FSL 300, according to some embodiments. The illustrative FSL 300 includes a plurality of transmission line structures 315a, 315b, 315c (315 generally) arranged in a vertical stack. Each transmission line structure 315a, 315b, 315c can include a respective first substrate 320a, 320b, 320c (320 generally) and one or more conductors disposed thereon (such as the conductors illustrated in FIG. 1 and described in detail above). A first substrate 320 may be comprised of a ferrite material, such as PC-YIG or SC-YIG. In some embodiments, a first substrate 320 may have a thickness of about 6 mil. Because the power threshold of the FSL depends on the smallest spacing between the signal and ground conductors, thinner substrates will translate into lower power thresholds. Thus, a wide range of substrate thicknesses can be used, for example but not limited to 2 mil thick substrates to 20 mil thick substrates. Substrates with tapered thickness across the length of the FSL, or in parallel to the length of the FSL, or in other directions can also be used.

The transmission line structures 115 may be electrically coupled to each other using wire bonds. For example, as shown in FIG. 3, a first transmission line structure 115a may be electrically coupled to a second transmission line structure 115b via first wire bonds 340a, and the second transmission line structure 115b may be electrically coupled to a third transmission line structure 115c via second wire bonds 340b.

Each transmission line structure 315a, 315b, 315c can include a respective second substrate 350a, 350b, 350c (350 generally) disposed below the first substrate 320. The second substrates 350 may serve to maintain a suitable spacing between the vertically stacked transmission line structures 315. In some embodiments, a second substrate 350 may have a thickness of about 8 mil. Because the power threshold can be lower with thinner substrates, one embodiment may have a thicker 6-8 mil YIG substrate on the input portion of the FSL, while additional YIG substrates that are closer to the output side of the FSL can have thinner substrates such as 2-3 mil. A second substrate 350 may be comprised of a laminate material, such as a laminate material manufactured by the ROGERS CORPORATION (sometimes referred to as a "Rogers material").

Figure 4:
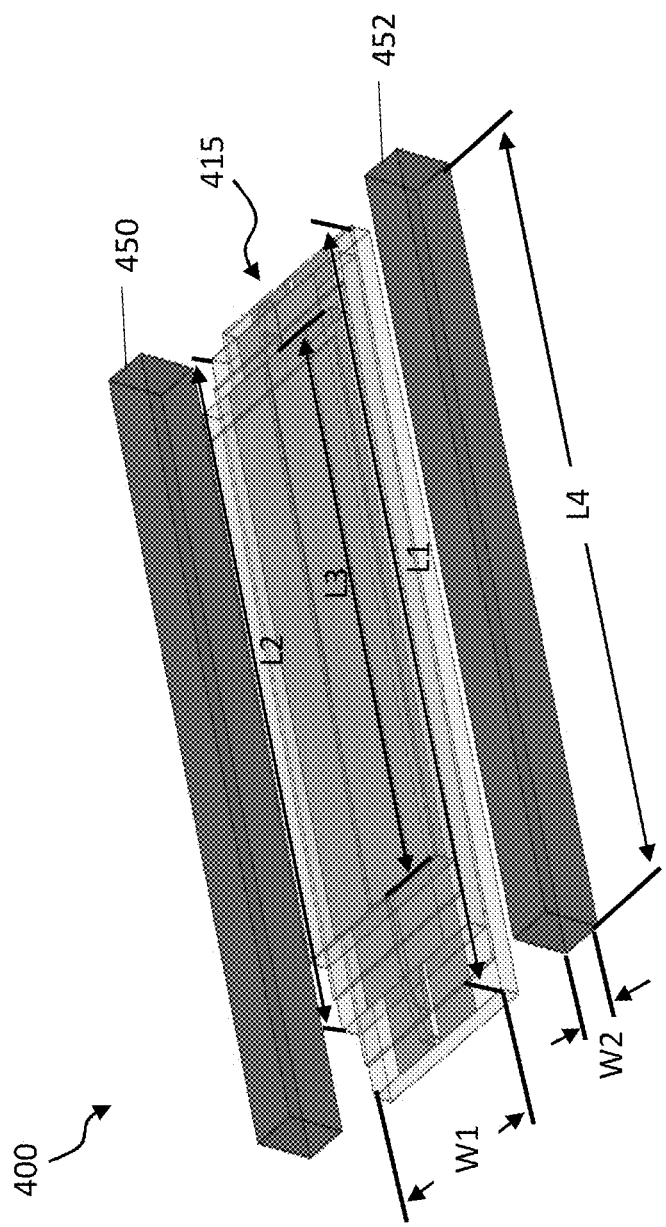
FIG. 4 is a perspective view of a magnetically biased FSL according to some embodiments of the present disclosure.

FIG. 4 shows an example of a magnetically biased FSL 400, according to some embodiments of the present disclosure. The FSL 400 includes a plurality of transmission line structures (e.g., three or more structures) arranged in a vertical stack 415 and bias magnets 450, 452 disposed along opposing lengths of the transmission line structures 415. In this example, the FSL 400 includes three transmission line structures 415 having lengths L1, L2, and L3, respectively, and each having a width W1. In some embodiments L1 may be in the range of 300 to 2000 mils, L2 may be in the range of 200 to 1950 mils, L3 may be in the range of 100 to 1900 mils, and W1 may be in the range of 50 to 500 mils. Bias magnets 450, 452 may each have a length L4 and a width W2. In some embodiments L4 may be in the range of 300 to 2500 mils and W2 may be in the range of 50 to 500 mils.

It is appreciated herein that vertically stacked FSL design disclosed herein can achieve performance comparable to the prior art but with significant (e.g. >60%) reduction in component length.

One skilled in the art will realize the concepts described herein may be embodied in other specific forms without departing from the spirit or essential characteristics thereof. The foregoing embodiments are therefore to be considered in all respects illustrative rather than limiting of the concepts described herein. Scope of the concepts is thus indicated by the appended claims, rather than by the foregoing description, and all changes that come within the meaning and range of equivalency of the claims are therefore intended to be embraced therein.

What is claimed is:

1. A frequency selective limiter (FSL) having an input port and an output port, the FSL comprising:
 a plurality of vertically stacked transmission line structures, wherein each one of the plurality of vertically stacked transmission line structures is electrically coupled to a transmission line structure disposed directly above it and with a first one of the plurality of vertically stacked transmission line structures having one end corresponding to the FSL input port and a second one of the plurality of vertically stacked transmission line structures having one end corresponding to the FSL output port; and wherein each of the plurality of vertically stacked transmission line structures comprises:
a magnetic material having first and second opposing surfaces; and
one or more conductors disposed on at least one of the surfaces of the magnetic material.

2. The FSL of claim 1 further comprising a substrate disposed between each of the plurality of vertically stacked transmission line structures.

3. The FSL of claim 1, wherein each subject transmission line structure is shorter than a transmission line structure disposed directly below the subject transmission line structure.

4. The FSL of claim 1 further comprising:
an input connector coupled to a bottom-most transmission line structure of the plurality of vertically stacked transmission line structures; and
an output connector coupled to a top-most transmission line structure of the plurality of vertically stacked transmission line structures.

5. The FSL of claim 1 further comprising:
an input connector coupled to a top-most transmission line structure of the plurality of vertically stacked transmission line structures; and
an output connector coupled to a bottom-most transmission line structure of the plurality of vertically stacked transmission line structures.

6. The FSL of claim 1 further comprising a fixture configured to house the plurality of vertically stacked transmission line structures.

7. The FSL of claim 1 further comprising wire bonds configured to electrically couple each of the subject transmission line structures to the transmission line structure disposed directly above the subject transmission line structure.

8. The FSL of claim 1 further comprising:
a first bias magnet disposed along a first length of the plurality of vertically stacked transmission line structures; and
a second bias magnet disposed along a second length of the plurality of vertically stacked transmission line structures.

9. The FSL of claim 8, wherein the first and second bias magnets are disposed such that they establish a DC magnetic field having a direction which is substantially parallel to a direction of an RF magnetic field.

10. The FSL of claim 8, wherein the first and second bias magnets are disposed such that they establish a DC magnetic field having a direction which is substantially perpendicular to a direction of an RF magnetic field.

11. The FSL of claim 1, wherein the magnetic material of any of the plurality of vertically stacked transmission line structures comprises a ferrite material.

12. The FSL of claim 11, wherein the ferrite material is one or more of: a Yttrium iron garnet (YIG), a single crystal (SC) YIG, polycrystalline (PC) YIG, hexagonal ferrite, or a variety of doped YIG materials, as well as calcium vanadium garnet (CVG), Lithium Ferrite, or Nickel Zinc Ferrite.

13. The FSL of claim 12, wherein two or more of the plurality of vertically stacked transmission line structures comprise a different ferrite material from one another.

14. The FSL of claim 1, wherein the one or more conductors are disposed on the first surface of the magnetic material to form a coplanar waveguide (CPW) transmission line.

15. The FSL of claim 14, wherein a first one of the one or more conductors corresponds to a first signal conductor having a width that decreases from a first end of the CPW transmission line to a second end of the CPW transmission line.

16. The FSL of claim 1, wherein one or more conductors disposed on a first surface of the magnetic material corresponds to a signal conductor having a width that decreases from a first end to a second end.

17. The FSL of claim 16 further comprising two ground conductors disposed on a second surface of the magnetic material and defining a gap therebetween, wherein a width of the gap decreases from the first end to the second end.

18. The FSL of claim 16 further comprising two first ground conductors disposed on a second surface of the magnetic material and defining a gap therebetween, wherein as the width of the first signal conductor decreases, a spacing between the two first ground conductors tapers so as to maintain a transmission-line impedance the same as at first and second ends of the first signal conductor.

* * * * *